(12) United States Patent
Shrinivasan et al.

(10) Patent No.: US 7,105,061 B1
(45) Date of Patent: Sep. 12, 2006

(54) METHOD AND APPARATUS FOR SEALING SUBSTRATE LOAD PORT IN A HIGH PRESSURE REACTOR

(75) Inventors: Krishnan Shrinivasan, San Jose, CA (US); Arkadiy Shimanovich, San Francisco, CA (US); Vladimir Starov, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 728 days.

(21) Appl. No.: 10/007,227

(22) Filed: Nov. 7, 2001
(Under 37 CFR 1.47)

(51) Int. Cl.
*C23C 16/00* (2006.01)
*H01L 21/306* (2006.01)
(52) U.S. Cl. .................. 118/733; 118/715; 118/719; 422/117; 422/118; 220/240; 156/345.31; 156/345.32; 251/63.5; 134/201
(58) Field of Classification Search ................ 118/715, 118/719, 733; 156/345.31, 345.32; 251/63.5; 220/240; 422/117, 118
See application file for complete search history.

(56) References Cited

U.S. PATENT DOCUMENTS 4,426,358 A * 1/1984 Johansson .................. 422/112

6,048,494 A * 4/2000 Annapragada ................ 422/33

FOREIGN PATENT DOCUMENTS

WO    WO01/55628 A1    8/2001

* cited by examiner

*Primary Examiner*—Karla Moore
(74) *Attorney, Agent, or Firm*—Martine Penilla & Gencarella, LLP

(57) ABSTRACT

Methods and an apparatus for providing an intrinsically safe chamber door for a processing chamber capable of operating at high pressures are provided. One exemplary apparatus includes a processing chamber for a substrate where the chamber is configured to operate at a positive pressure. The processing chamber includes a port loading slot for providing access for the substrate into and out of the chamber. A chamber door positioned inside the chamber is included. The chamber door is configured to seal against an internal surface of the chamber thereby blocking access through the port loading slot. An internal pressure of the chamber assists in sealing the chamber door against the internal surface of the chamber. Also included is a door actuating mechanism configured to move the door along a door path where the door path is positioned at an angle to a path to be traversed by the substrate.

10 Claims, 14 Drawing Sheets

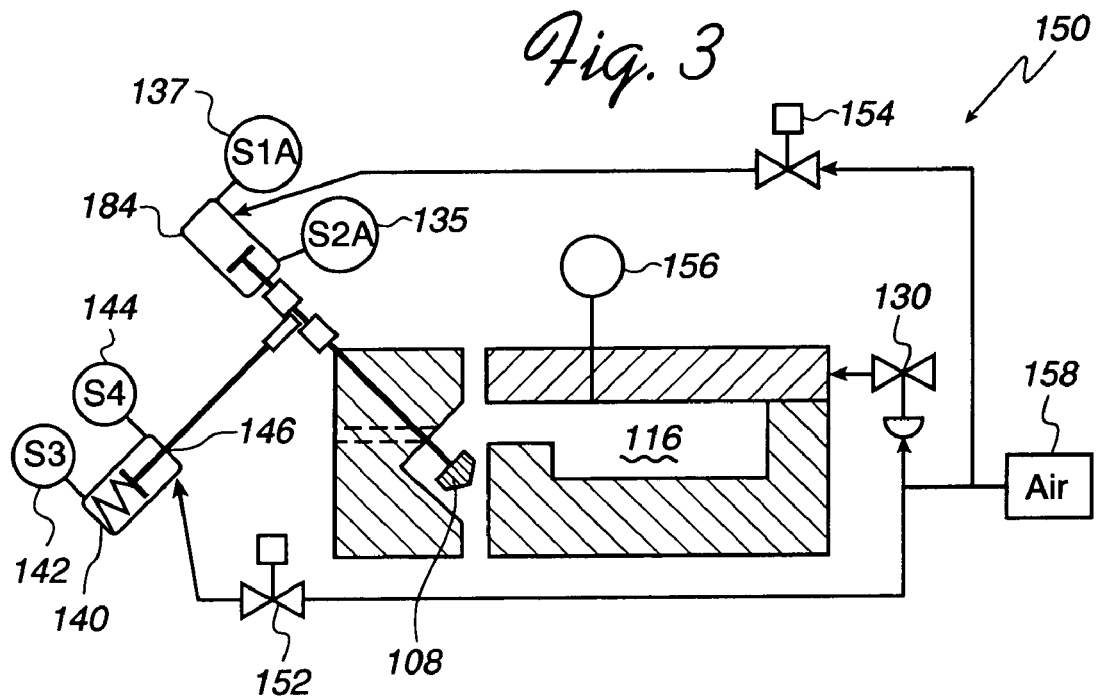
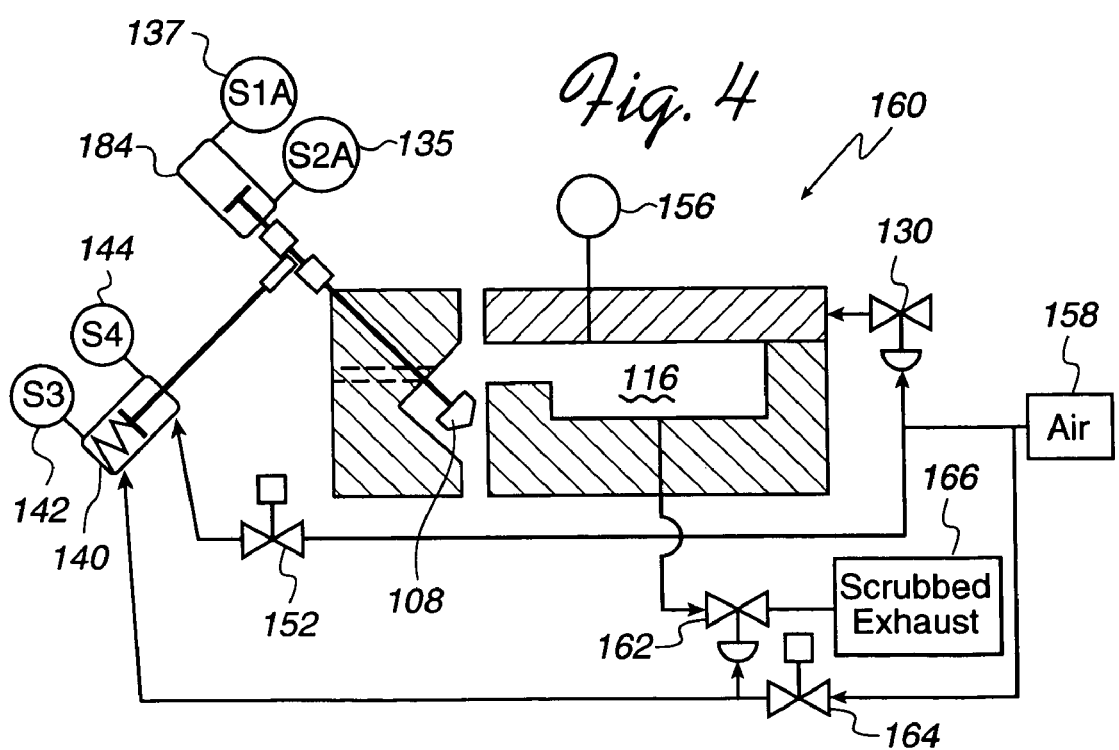

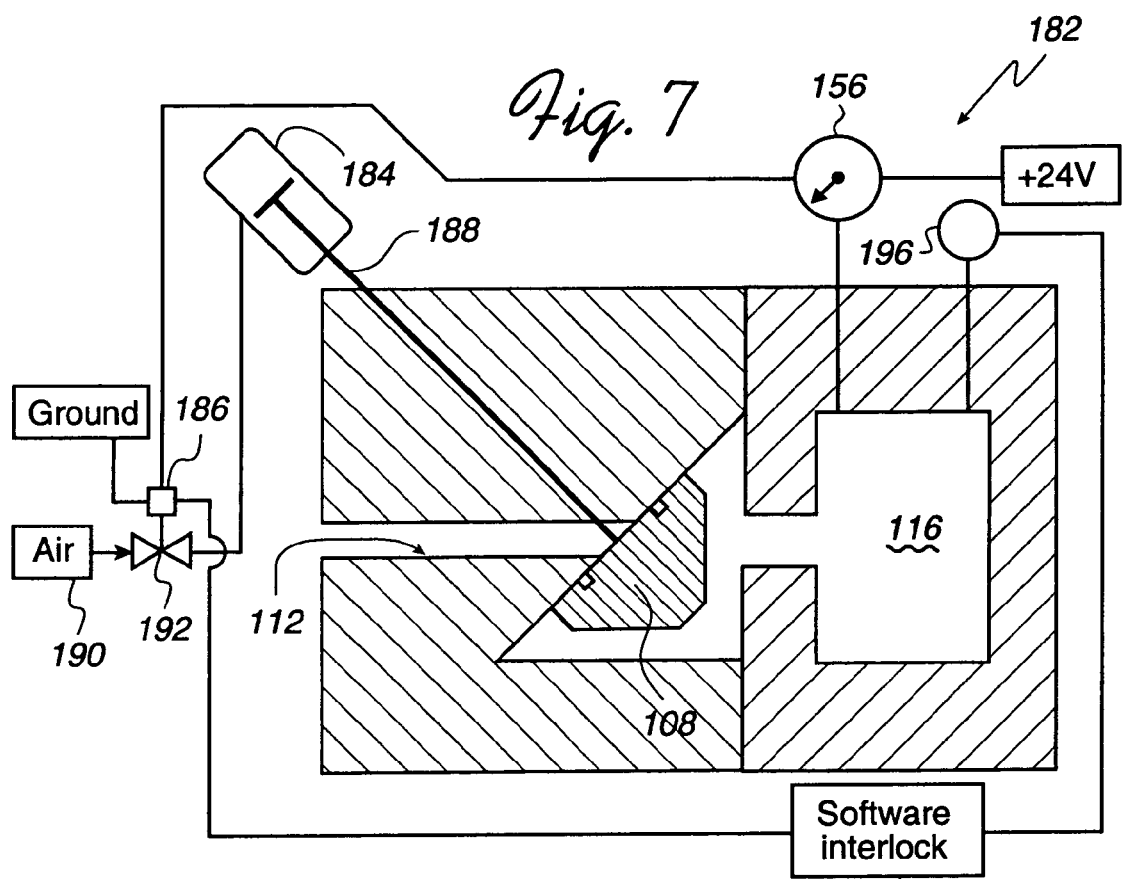
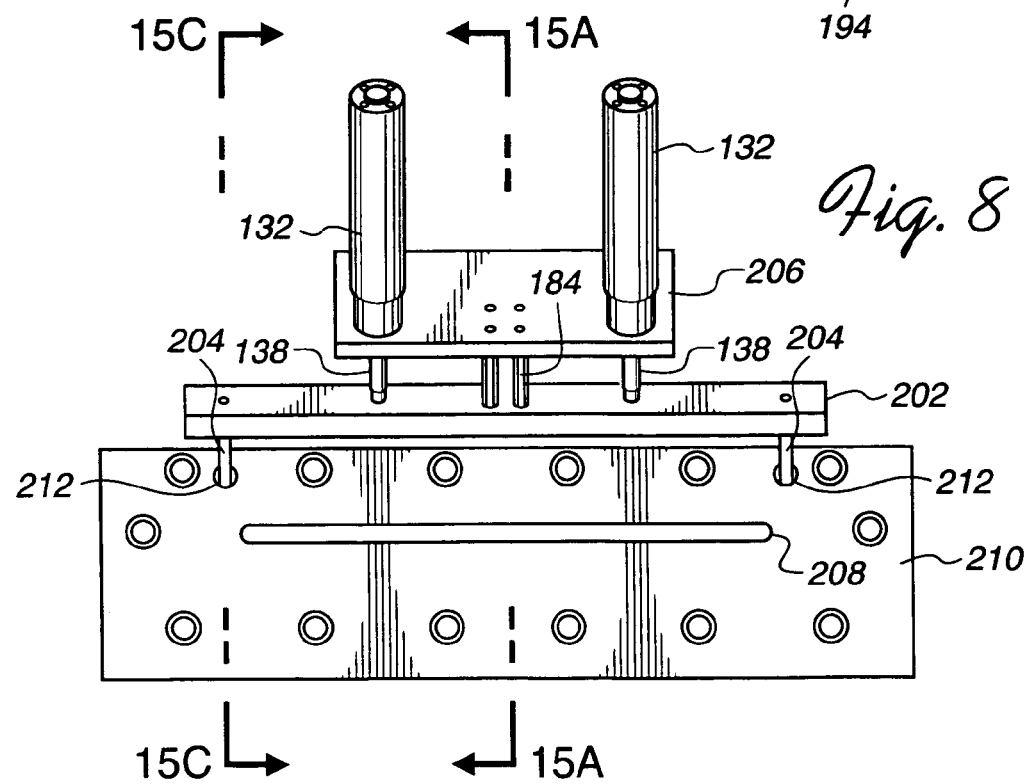

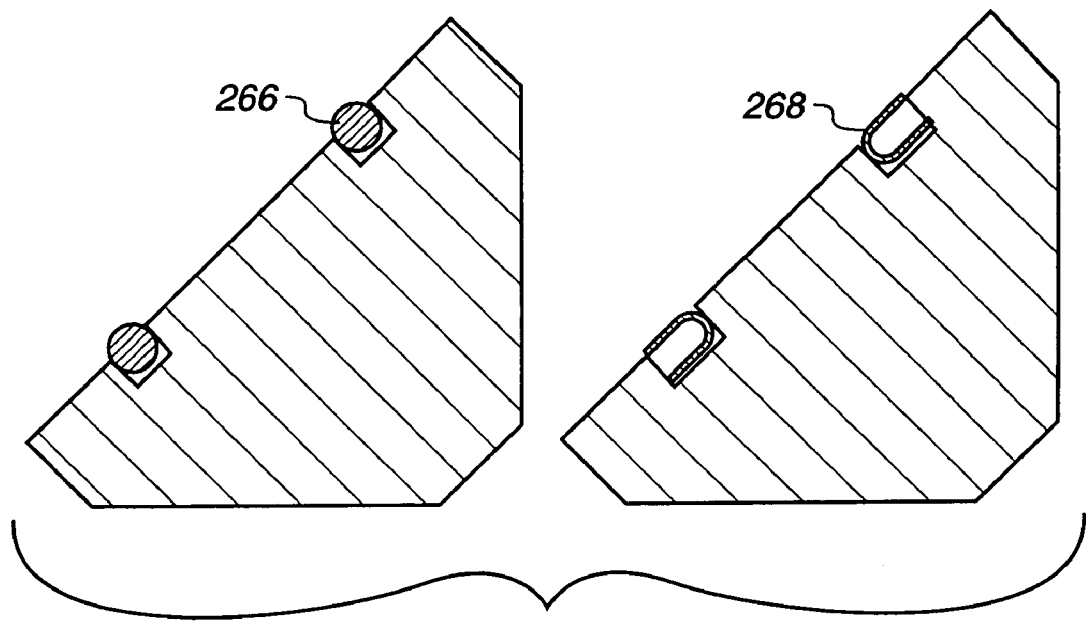
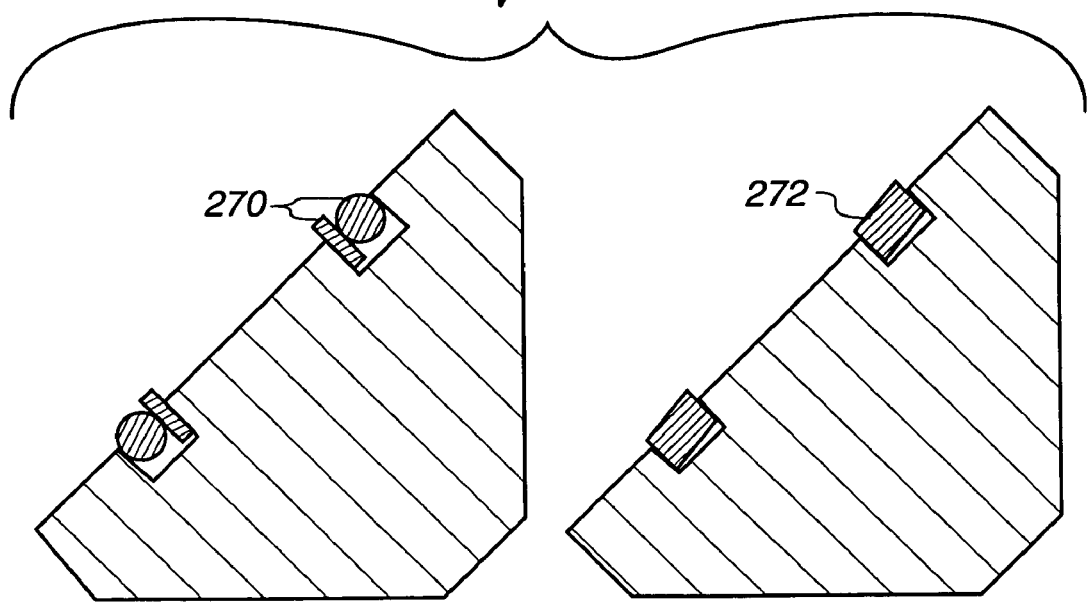
Fig. 11B

METHOD AND APPARATUS FOR SEALING SUBSTRATE LOAD PORT IN A HIGH PRESSURE REACTOR

BACKGROUND OF THE INVENTION

1. Field of the Invention

This invention relates generally to methods and apparatus for sealing a chamber and more particularly for providing a door mechanism that is intrinsically safe and capable of withstanding high pressures within a chamber.

2. Description of the Related Art

High pressure processing of semiconductor substrates is taking on greater importance because of the advent of new formulations for inter-layer dielectrics (ILD). Other technological trends, such as the reduction in size of various interconnect features, are also hastening the move to non-conventional process technologies such as high pressure. Some of these newer ILD materials are incompatible with traditional methods for removal of photoresist and post-etch residue. Conventional methods of removing photorersist, such as the use of plasma processes, cause damage to the ILD. Plasma processes, typically employing the excitation of oxidizing species such as oxygen and fluorine-containing gases using Radio Frequency (RF) or microwave (MW) energy may not distinguish between the photoresist and the underlying ILD. This is especially true of organic and organosilicate glass materials such as Dow Chemical's SILK™, Novellus Systems' CORAL™, Applied Materials' BLACK DIAMOND™, etc.

Plasma processes damage these ILD materials by either etching them and causing loss of critical dimensions, or by chemically altering them and causing an increase in their capacitance. Wet processes such as the use of solvents like N-methyl pyrilidone (NMP), hydroxylamines, etc. are limited by their ability to wet ever-decreasing feature sizes. As feature sizes shrink below 100 nm, the ability to get active chemicals into features such as vias and trenches becomes limited by surface tension. Wet processes are also not desirable for porous ILD materials. Absorption of water and other solvents in the pores of the ILD could result in the increase of capacitance. As an example of high pressure process, super critical carbon dioxide is being used for removal of photoresist and post etch residue from some of the newer ILD formulations. With super critical carbon dioxide processing, the chamber can achieve an internal pressure up to 5000 pounds per square inch (psi). The processing capability of super critical carbon dioxide is augmented by the addition of small quantities of chemical additives. These additives enhance solubility of photorersist and post etch-residue in the super critical carbon dioxide or provide reactivity necessary to break up polymeric or other chemical bonds in the residue. Of course, the use of high pressure brings with it safety concerns. For example, any leaks from the chamber may lead to emissions of the additive chemicals into the environment outside the chamber. An additional source of concern is the high stresses to which the components of the process chamber are subjected. Proper design of the wafer load port or door is necessary to prevent leakage of process fluid and mechanical failure of the door itself.

At the same time, the semiconductor industry is moving to processing single wafers as opposed to batch processing. As the transition from 200 mm substrates to 300 mm substrates becomes more pervasive, the movement to processing single wafers accelerates further.

The combination of these two trends requires development of single-substrate high-pressure chambers. As part of these chamber designs, there must be a port for loading the substrate into the chamber for processing. A great deal of consideration must be given to design of these ports and to the door mechanism that seals the port during processing. The door must have the capability of both sealing against leakage of process fluids under large internal chamber pressures (up to 5000 psi) and be sufficiently strong to withstand the high mechanical stresses imposed by such large operating pressures. Additionally, the door must be reliable enough to withstand the repeated pressurizing and de-pressurizing associated with processing single wafers.

Since most semiconductor processing chambers work at atmospheric pressure or below, door safety is not of consequence. Moreover, for vacuum chambers an external door is the preferred design since the higher external pressure enhances door sealing by exerting a force on the door against its seal. While an external door may work well for a vacuum chamber, they suffer from several disadvantages in a high pressure environment. For example, since the force due to the internal chamber pressure is working against the seal that the external door makes with the chamber, the structure to hold the door securely against the seal at high pressures has to be fairly massive. Accordingly, an externally sealed door with the attendant need for massive actuation and sealing components takes up more space. This increases the substrate-handling robot's reach requirements. Moreover, provision of these actuation components complicates the design of external exhaust ducts and hoods necessary to capture fugitive emissions from an open door or to account for the failure of a door seal during processing.

U.S. Pat. No. 6,228,563 to Starov et al. describes such an external door mechanism for a high pressure chamber. The location and size of the external door mechanism is also shown therein. The shortcomings of such an approach are evident from the massive and complicated actuation mechanisms necessary to restrain and support the door against an internal chamber pressure. Other mechanisms for removing the door from the axis of substrate motion are also necessary. Additionally, the substrate load ports must make allowance for partial insertion of the thick portion of a substrate-handling robot's end effector. This allowance increases the area over which the internal chamber pressure may act on an external door.

U.S. Pat. No. 5,857,368 to Grunes et al and U.S. Pat. No. 5,518,771 to Jeffryes et al. describe another means of accessing the interior of a high-pressure semiconductor processing chamber. Hydraulic presses are employed to move the upper and lower chamber halves away from each other to create an opening through which a semiconductor substrate may be introduced into a process cavity. Because the same mechanisms that move the chamber halves away from each other also have to support the large internal load generated by process pressure, these mechanisms are massive. Movement of large components involves overcoming large inertial forces and can lengthen the time necessary to remove a processed substrate and replace it with an unprocessed substrate, which in turn decreases throughput.

As a result, there is a need to solve the problems of the prior art to provide an intrinsically safe and robust door capable of handling high pressure semiconductor processing.

SUMMARY OF THE INVENTION

Broadly speaking, the present invention fills these needs by providing a method and apparatus for a robust and safe door capable of accommodating high chamber pressures required for semiconductor processing. It should be appreciated that the present invention can be implemented in numerous ways, including as a process, an apparatus, a system, or a device. Several inventive embodiments of the present invention are described below.

In one embodiment, an apparatus for a processing chamber for a substrate is provided where the chamber is configured to operate at a positive internal pressure. The processing chamber includes a load-port slot that provides access for the substrate into and out of the chamber. A chamber door is included where the chamber door is positioned inside the chamber. The chamber door is configured to seal against an internal surface of the chamber thereby blocking access through the load-port slot such that an internal pressure of the chamber assists in sealing the chamber door against the internal surface of the chamber. The processing chamber includes a door actuating mechanism configured to move the door along a door path where the door path is positioned at an angle to a path to be traversed by the substrate.

In another embodiment, a chamber for processing a semiconductor substrate is provided where the chamber is configured to operate while pressurized. The chamber includes a port for providing access for the semiconductor substrate into and out of the chamber. Also included is a moveable door configured to utilize a pressure differential between an internal pressure of the chamber and an external pressure outside of the chamber to seal the port. The port is sealed by a door forming a seal with an internal surface of the chamber enclosing the port. The chamber includes a control mechanism configured to transition the moveable door between an open position and a sealed position. The transition between the opened position and the sealed position occurs at an angle to the axis of a path to be traversed by the semiconductor substrate.

In still another embodiment, a method for sealing a processing chamber with an intrinsically safe chamber door where the chamber door is positioned on the inside of the chamber is provided. The processing chamber is configured to operate at an elevated internal pressure. The method initiates with a substrate transitioning through an opening of the processing chamber. Next, the chamber door is positioned to form an initial seal against an internal surface of the chamber around the opening. Then, a pressure is created in the chamber. Next, the initial seal between the chamber door and the internal surface is further reinforced by the increased internal chamber pressure. Here the internal pressure produces a sealing force against the chamber door which is transferred to the internal surface of the chamber such that as the pressure increases the sealing force increases.

In yet another embodiment, a method for sealing a semiconductor processing chamber with an interlocked chamber door is provided. The chamber door is located on the inside of the chamber and the processing chamber is configured to operate at a positive pressure. The method initiates with locating the chamber door to form an initial seal against an internal surface of the chamber around the opening. Next, the chamber is pressurized. Then, multiple interlocking schemes are provided to prevent the chamber door from opening when the chamber is at or above a defined pressure. Next, the initial seal between the chamber door and the internal surface of the chamber is further reinforced such that the chamber pressure is used to reinforce the initial seal.

The advantages of the present invention are numerous. Most notably, the inside-out sealing of the door creates an intrinsically safe design. Additionally, the door uses the inside pressure of the chamber to create a stronger seal, thus as the pressure increases the seal integrity increases. Therefore, the door can withstand much higher pressures. In addition, the low mass and inertia of an internal door mechanism translates to faster opening and closing of the chamber door. Through the use of overlapping interlocks the safety of the door can be further enhanced. The door mechanism is capable of being integrated into airlocks and vacuum load locks.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3 depicts a block diagram presenting an interlocking scheme that requires the chamber to be depressurized before the door can be opened in accordance with one embodiment of the invention.

FIG. 4 depicts a block diagram displaying an interlocking scheme to prevent door from opening before the chamber is vented in accordance with one embodiment of the invention.

FIG. 7 illustrates a block diagram displaying multiple overlapping interlocks between the chamber door and the chamber in accordance with one embodiment of the invention.

FIG. 8 illustrates a side plan view of the door actuating mechanism in accordance with one embodiment of the invention.

FIG. 11B illustrates exemplary embodiments of the door seal in accordance with one embodiment of the invention.

DETAILED DESCRIPTION OF THE PREFERRED EMBODIMENTS

Figure 1:
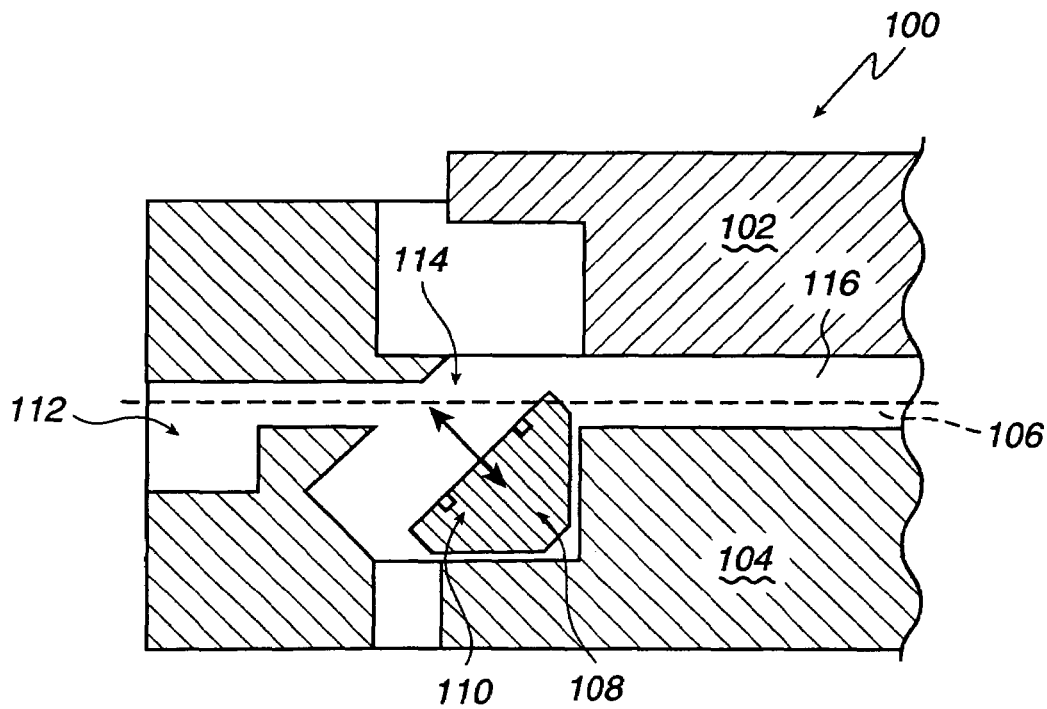
FIG. 1 illustrates a block diagram depicting a safe and reliable door mechanism in accordance with one embodiment of the invention.

An invention is described for an apparatus and method for sealing a chamber where high internal pressures are generated during processing operations in the chamber. It will be obvious, however, to one skilled in the art, that the present invention may be practiced without some or all of these specific details. In other instances, well known process operations have not been described in detail in order not to unnecessarily obscure the present invention.

The embodiments of the present invention provide an apparatus and method for providing a robust door and a sealing mechanism capable of withstanding chamber pressures up to 5000 pound per square inch (psi). Additionally, the design of the door is intrinsically safe so as to prevent inadvertent opening of the door while the chamber is pressurized. Interlocking schemes using sensors also prevent the operation of the door under improper conditions. In a preferred embodiment, a first actuator (or set of actuators) places the door in a closed position to create an initial seal, then the chamber is pressurized, wherein the internal pressure of the chamber is used to assist in sealing the door. Included in this embodiment is a second smaller actuator that is used to open the door. By selecting proper sizes of the first and second actuators to manipulate a ratio of the door seal area to the piston area of the respective actuators, an additional level of safety is provided that prevents the door from opening until the pressure decreases below a certain level.

Processes requiring high operating pressures include super critical carbon dioxide processing, high pressure oxidation, densified fluid cleaning, and high pressure reflow. Super critical carbon dioxide processing is typically employed for photoresist stripping operations, post-etch residue removal operations as well as for metal and dielectric deposition applications. Typically, carbon dioxide and an active chemical agent, which may include toxic or irritant chemicals, are injected into the chamber and the internal pressure of the chamber is increased. In such processes, safety for personnel in the vicinity of the chamber is of paramount concern with operating pressures inside the chamber of up to 5000 psi. At the same time, assurance that the toxic chemicals inside the chamber can not escape from any of the seals is equally important.

The current design seeks to take advantage of the difference in pressure between the inside and outside of the chamber. Since the door is sealed inside out, i.e., it makes a seal against an internal surface of the chamber, the pressure difference assists in the integrity of such sealing. This mechanism provides substantial safety against failure of mechanical components. Additionally, the door transfers stress caused by high internal pressure to the load port and not an actuation mechanism. Since the door actuation mechanism is removed from the load port, large fasteners sufficient to withstand this load can be used to bolt the load port to the chamber. Another embodiment of this invention is the instrumentation of the various actuators and chamber parts configured in such a manner as to permit multiple overlapping interlocks in order to ensure safety as will be discussed in more detail below.

FIG. 1 illustrates block diagram 100 depicting a safe and reliable door mechanism in accordance with one embodiment of the invention. Block diagram 100 shows a processing chamber top 102 and a processing chamber bottom 104 of a processing chamber defining a processing chamber cavity (not shown). It should be appreciated that the processing chamber is constructed to operate at high pressures i.e., up to 5000 psi. Chamber door 108, shown in the open position, allows for a substrate or wafer to pass along a substrate path 106 between the chamber cavity and the chamber load port 112. The chamber door 108 forms a seal to close the opening between the chamber load port 112 and chamber inside 116 by compressing chamber door seals 110 against the chamber wall through which the opening passes.

In one embodiment of the chamber of FIG. 1, the door 108 includes a slider mechanism that moves the door at an angle to the axis of the chamber load port, as depicted by directional arrow 114, through which a substrate is introduced into the chamber. In another embodiment, the chamber door 108 is a stainless steel door capable of withstanding 5000 psi and the associated stresses caused by high pressure environments. In yet another embodiment, the seal 110 of the door 108 is an elastomeric seal, either embedded in specially designed grooves or molded to the door itself, wherein the seal 110 compresses against a surface on the inside of the chamber to form a seal. It should be appreciated that when a substrate is being loaded or removed, the door is relaxed against the chamber bottom 104 to allow room for substrate motion in or out of the chamber along path 106.

Continuing with FIG. 1, after the substrate has been loaded into the chamber, actuators (either electrical or pneumatic) cause the door 108 to move up diagonally until it seals against the chamber load port 112, covering the entire opening between the chamber load port 112 and the chamber. The actuators of this embodiment provide the initial sealing force so that as the high-pressure reagent is introduced into the chamber, there are no leaks around the door. After the chamber has attained sufficiently high pressure, the door seals are pressure-sealed, i.e., internal chamber pressure forces the door against the internal surface of the chamber, thereby creating a stronger seal as the pressure in the chamber increases.

In one embodiment, the door mechanism of FIG. 1 includes the use of one or more larger actuators to close and initially seal the door 108 as mentioned above. A second smaller actuator is used to open the door 108. In this embodiment, the mechanical advantage offered by the ratio of door seal area to the piston area of the actuator used to open the door provides a first level of safety. For example, assume that 80 psi air is used for actuation purposes, and a ½ inch bore actuator is selected to open the door. A door for a 300 mm wafer is approximately 13 inches long and ½ inch wide. Therefore, the ratio of areas between the door and the actuator is:

$$\text{Ratio} = \frac{DoorArea}{ActuatorBoreArea} = \frac{(13)(0.5)}{\pi(0.25)^2} = 33.$$

This means that the door will not open until the chamber pressure decreases below:

$$PressuretoOpen = \frac{ActuationPressure}{Ratio} = \frac{80}{33} = 2.4 \text{ psig.}$$

The door design 108 in this embodiment is thus intrinsically safe, i.e, it is not mechanically possible to open the door as long as the chamber is under more than 2.4 psi internal pressure. It should be appreciated that the design of the actuators determine what the internal pressure of the chamber must be for the actuators to overcome the internal pressure of the chamber to open the door. Therefore, while the above example shows a design where it is not mechanically possible to open the door 108 when the internal pressure is 2.4 psi, any design can be chosen to overcome a higher or lower internal chamber pressure. The actuators are described in more detail below.

Figure 2:
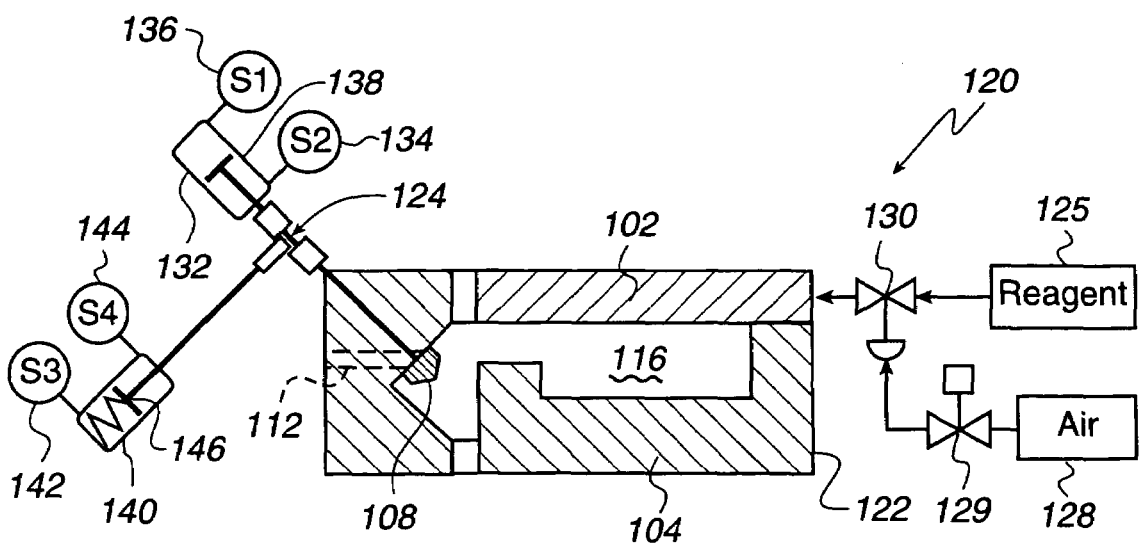
FIG. 2 illustrates a block diagram displaying an interlocking scheme for the door mechanism that requires the door to be closed before the chamber is pressurized in accordance with one embodiment of the invention.

FIG. 2 illustrates block diagram 120 displaying an interlocking scheme for the door mechanism that requires the door to be closed before the chamber is pressurized in accordance with one embodiment of the invention. This scheme can be implemented to overcome the possibility that reagents 126 may be introduced into the chamber 122 without having secured the chamber door 108. In one embodiment, the door-closing cylinder 132 is equipped with position sensors S1 136 and S2 134 that detect the position of the piston 138 within the actuator body of door-closing cylinder 132. A pneumatically actuated locking mechanism provides a mechanical interlock preventing door 108 from moving. In one embodiment, the lock actuator 140 is a spring-return construction, i.e., the cylinder requires air pressure on one side of the piston to keep the door mechanism unlocked. The fail-safe condition positions the lock actuator 140 to lock position 124 where door-closing cylinder 132 is prevented from moving. It should be appreciated that while FIG. 2 represents door 108 in an closed position, lock actuator 140 may also be positioned to prevent door-closing cylinder 132 from moving when door 108 is opened. In this embodiment, preventing the door from moving when the door is open would prevent accidental damage to a robot arm as a substrate is being transitioned to or from the process chamber 116.

Continuing with FIG. 2, lock actuator 140 is equipped with position sensors S3 142 and S4 144. Positive shutoff valve 130 permits introduction of the reagent into the chamber 122. In one embodiment, software interlocks are written to prevent opening of the valve 130 unless switches S1 136 and S4 144 indicate that the door is both closed and locked, respectively. Furthermore, the contacts of these switches (S1 and S4) may be wired, either directly or through an interposing electromechanical relay, into the solenoid valve 129 that controls air supply to shutoff valve 130, thus preventing shutoff valve 130 from being opened unless the switches S1 136 and S4 144 are closed. In one embodiment, if the lock was released without the door 108 being completely closed, mechanical design of the locking feature would prevent full extension of the lock actuator piston 146, as depicted in FIG. 2. Thus, the switch S4 144 would not be actuated, thereby preventing introduction of the reagent.

FIG. 3 depicts block diagram 150 presenting an interlocking scheme that requires the chamber 116 to be depressurized before the door 108 can be opened in accordance with one embodiment of the invention. The mechanical advantage of such a door mechanism will prevent door 108 from opening whenever the internal pressure is higher than a nominal amount, i.e., 2.4 psi, as discussed in the example above. Of course, an internal pressure for opening, which is higher or lower than 2.4 psi is possible, as discussed above. It should be appreciated that overlapping interlocks minimize any leakage of potentially toxic reagents. In FIG. 3, the door opening actuator 184 carries position switches S1A 137 and S2A 135. Actuation air 158 is supplied to one side of door opening actuator 184 by the solenoid valve 154 to open the door 108. The door-locking actuator 140 is supplied actuation air 158 by solenoid valve 152 to overcome its internal spring and retract the lock. The process chamber 116 is equipped with a pressure switch 156 that is designed to change states when the internal chamber pressure exceeds a pre-defined pressure. This switch is configured so that its contacts come open when chamber pressure exceeds the pre-defined pressure. The switch contacts of pressure switch 156 are wired, either directly or through an interposing electromechanical relay, in series with solenoid valves 152 and 154 thus preventing either from causing the door 108 to unlock or open respectively when chamber pressure exceeds the pre-defined pressure.

FIG. 4 depicts block diagram 160 displaying an interlocking scheme to prevent door 108 from opening before the chamber 116 is vented in accordance with one embodiment of the invention. Most semiconductor substrate chambers have a vent that is opened to scrubbed exhaust 166. This vent is equipped with a normally open vent valve 162. The purpose of vent valve 162 is to direct the last remnants of reactants from the chamber 116 to scrubbed exhaust, especially when the chamber is being purged with an inert gas such as nitrogen, argon, helium and the like. Vent valve 162 also serves as a fail-safe method for depressurizing a chamber 116 should there be a catastrophic failure in either power or pneumatic supply. A normally open vent valve 162 demands air supply to the actuator in order to close vent valve 162. In the interlocking scheme of FIG. 4, the solenoid valve 164 used to actuate vent valve 162 to its closed position, could be used to also supply air pressure to the spring side of door locking actuator 140. Thus, even if solenoid valve 152 were to be accidentally actuated, the air pressure allied with the spring force would be more than sufficient to counteract the air pressure supplied by solenoid valve 152. This would prevent, under any circumstance, unlocking of the door mechanism. In one embodiment, the door-opening actuator 184 would not possess the ability to exert sufficient force to shear the lock mechanism, and the door would be safe.

Figure 5:
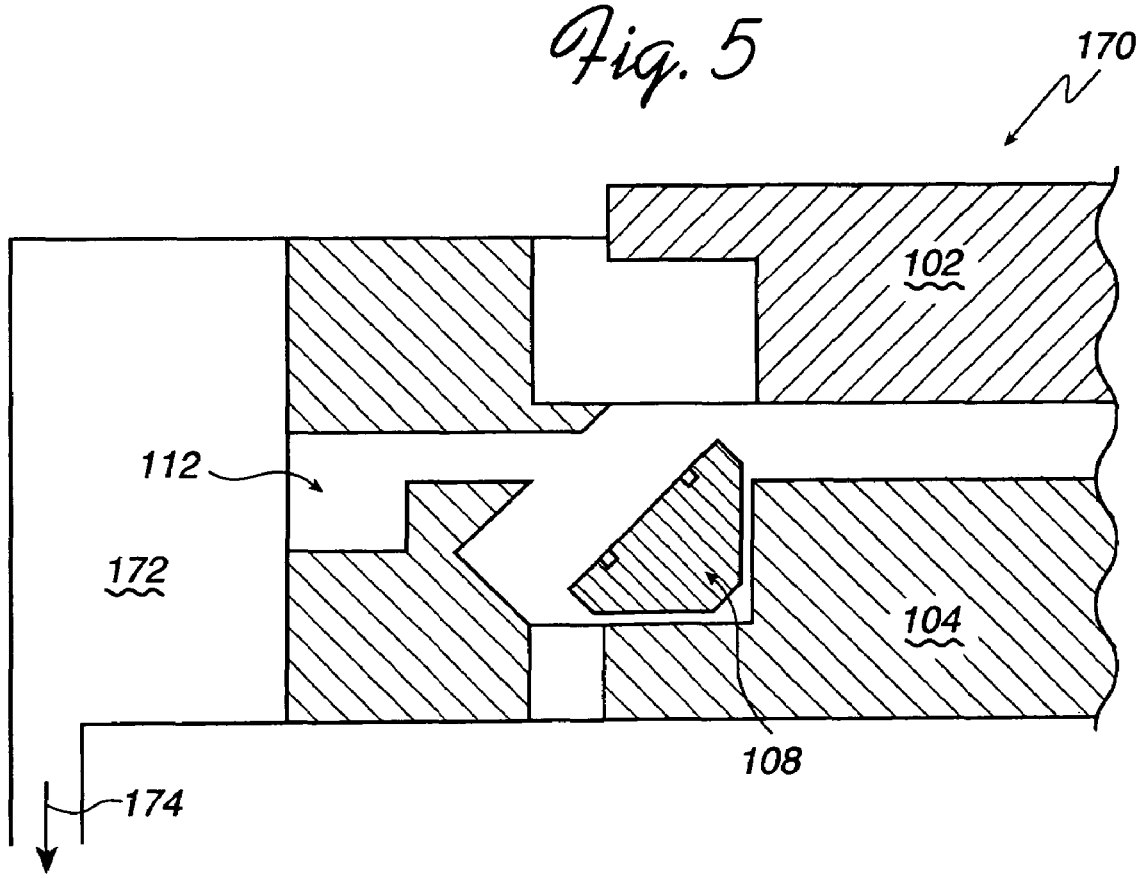
FIG. 5 illustrates a block diagram displaying the use of an airlock in conjunction with the chamber in accordance with one embodiment of the invention.

FIG. 5 illustrates block diagram 170 displaying the use of an airlock in conjunction with the chamber 116 in accordance with one embodiment of the invention. It should be appreciated that since door actuation parts do not protrude outside the load port 112, it is possible to attach a scavenger hood or an airlock 172 to the front of the chamber to protect against accidental release of process gas through a failed seal. As will be described in more detail below, the door actuation parts are located outside of the chamber load port in one embodiment, therefore, there are no moving parts inside the chamber load port. Accordingly, a scavenger hood or airlock can provide a cleaner environment in the vicinity of the wafer path as it is transitioned between the load port 112 and the chamber 116. In one embodiment of the invention the scavenger hood or the airlock exhausts the intake to the outside environment as depicted by arrow 174. In another embodiment, the scavenger or airlock is a vacuum loadlock such as those commonly used in semiconductor manufacturing equipment to create clusters of two or more process chambers.

Figure 6:
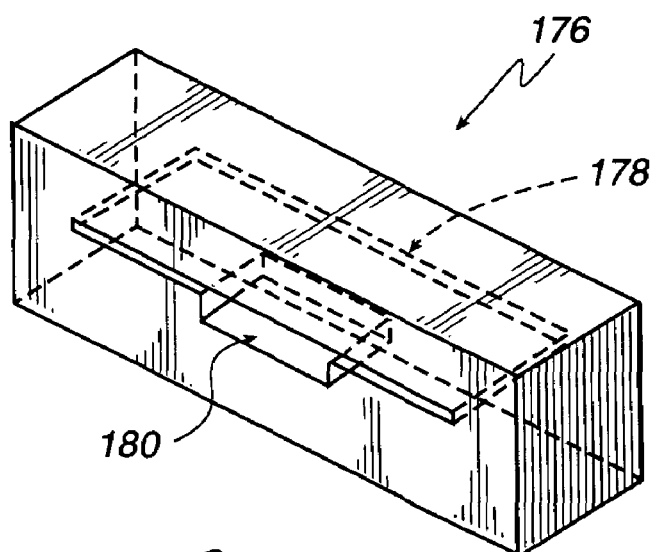
FIG. 6 illustrates a block diagram portraying the reduced area for internal sealing of the door mechanism in accordance with one embodiment of the invention.

FIG. 6 illustrates block diagram 176 portraying the reduced area for internal sealing of the door mechanism in accordance with one embodiment of the invention. It should be appreciated that since the door 108 is internal to the chamber 116, the wetted area of the load port slot on the chamber side 178 (internal) is less than the wetted area of the load port slot on load port side 180 (external). As demonstrated in FIG. 6, the external side 180 requires extra area where a certain amount of the wall is milled out to accommodate robot end effector motion and also the presence of a thick wrist at the end of the end-effector. Accordingly, since the wetted area of the internal surface 178 is smaller than the wetted area of the external surface 180, the load on an internal door is less than the load on an external door.

FIG. 7 illustrates block diagram 182 displaying multiple overlapping interlocks between the chamber door 108 and the chamber 116 in accordance with one embodiment of the invention. Door opening cylinder 184 operates to open chamber door 108 through piston 188 and is pressurized by actuation air 190. As described with reference to FIG. 1, door opening cylinder 184 is sized to be capable of opening the door 108 only if a certain pressure is not exceeded in the chamber 116, thus providing one mechanical level of safety. Solenoid valve 186 operates such that an electrical signal is received to open the valve 192 to allow air 190 to flow to door opening actuator 184 thereby forcing piston 188 to open chamber door 108. In one embodiment, valve 192 is a three way valve, thereby allowing air to vent from door opening cylinder 184 when the solenoid valve 186 is closed. Pressure switch 156 provides a second level of safety for opening the door while the chamber is pressurized. In one embodiment, the pressure switch opens when the pressure exceeds a defined value. As displayed in FIG. 7, solenoid valve 186 is wired either directly or through an interposing electromechanical relay, through the pressure switch 156 so that the solenoid valve 186 will not receive an electrical signal unless the pressure is less than or equal to a defined value. Here, it is electrically impossible to operate the door if the chamber pressure is more than the defined limit or even if the wire is cut i.e., it is fail safe.

A third level of safety includes the use of a software interlock 194 in one embodiment. Here, a pressure transducer 196 senses the pressure in the chamber 116. The software interlock is programmed to not allow the solenoid 186 to open unless a defined pressure or a pressure less than the defined pressure exists in the chamber 116. In this embodiment, there exists a mechanical safety through the size of the door opening actuator 184, an electrical safety by hard wiring through the pressure switch 156 and a software safety via the software interlock 194.

FIG. 8 illustrates a side plan view of the door actuating mechanism in accordance with one embodiment of the invention. Here door closing cylinders 132 are attached to cylinder bracket 206. Pistons 138 of each of the door closing cylinders are attached to door actuator bar 202. Door actuator rod 204 is attached to door actuator bar 202 on one end and the door (not shown) on the other end. As illustrated by FIG. 8, door actuator rod extends through door holder 210 through bores 212. In one embodiment, the bores 212 are configured so as to not impede the transition of a wafer or semiconductor substrate through the port 208 into or out of the chamber while remaining outside the sealing perimeter of seal 218. Door opening cylinder 184 is shown attached to door actuator bar 202. As discussed above with reference to FIGS. 1 and 7, door opening cylinder 184 is sized to provide a built-in mechanical safety to prevent opening the door when the pressure in the chamber is above a defined limit in one embodiment. It should be appreciated that while FIG. 8 does not illustrate a milled out section of door holder 210 to accommodate robot end effector motion, in another embodiment door holder 210 includes the milled out section as depicted in FIG. 6.

Figure 9:
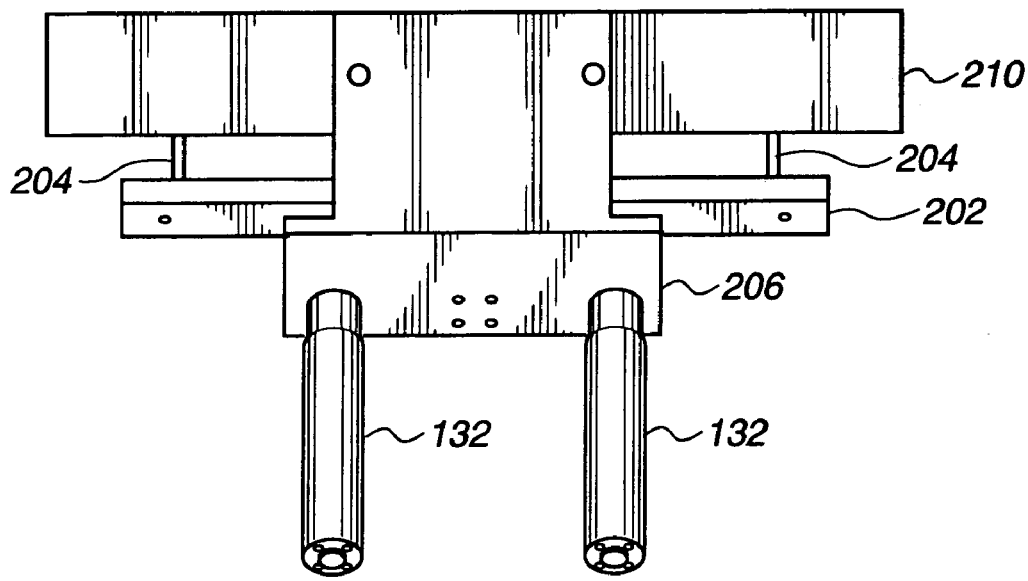
FIG. 9 illustrates a top plan view of a door actuating mechanism in accordance with one embodiment of the invention.

FIG. 9 illustrates a top plan view of a door actuating mechanism in accordance with one embodiment of the invention. Here it can be seen that the cylinder bracket 206 is rigidly connected to the door holder 210 in this embodiment. It should be appreciated that the door actuating mechanism can be referred to as a control mechanism for the purposes of this invention.

Figure 10:
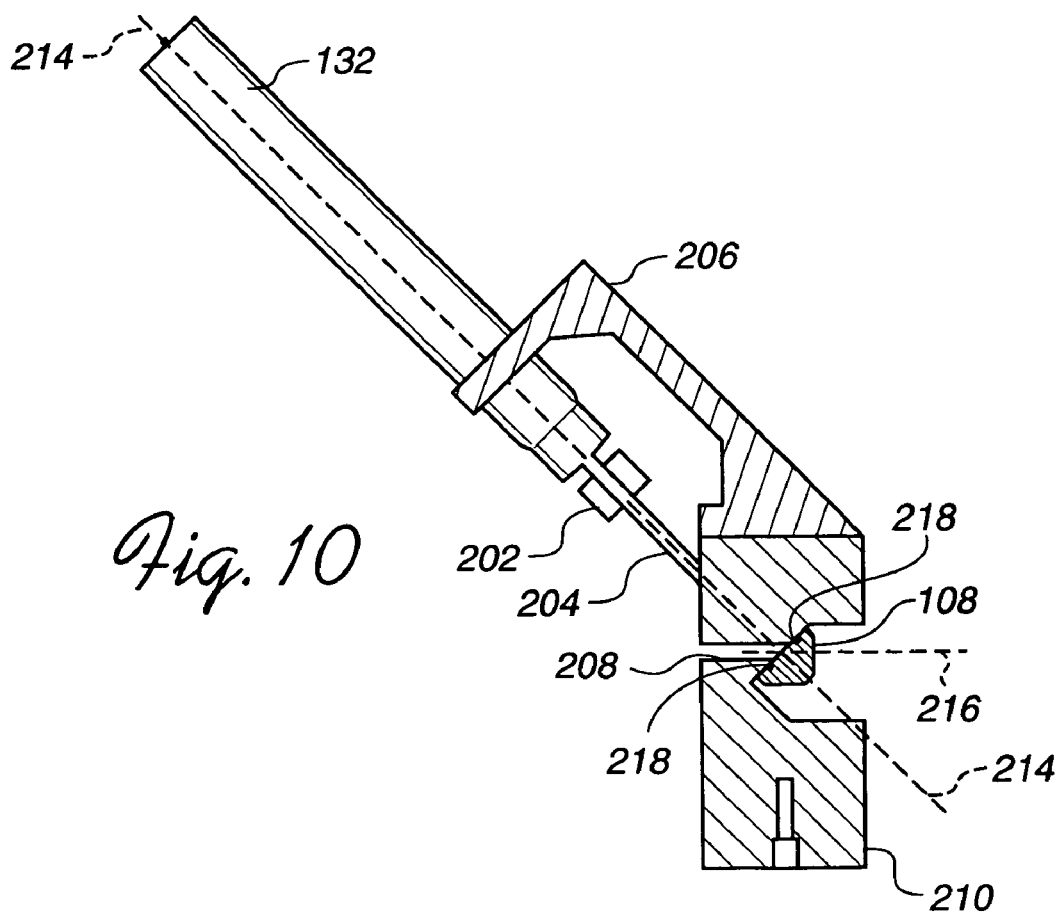
FIG. 10 illustrates another side plan view of a door actuating mechanism in accordance with one embodiment of the invention.

FIG. 10 illustrates a side plan view of a door actuating mechanism in accordance with one embodiment of the invention. Door 108 is in a sealed position, thereby blocking access to the chamber through port loading slot 208. Axis 214 which is the axis that the door 108 travels between the opened and closed (sealed) positions is at an angle to axis 216, where axis 216 is the axis of a path that a semiconductor substrate traverses into and out of the chamber. Furthermore, door actuation rod 204 is attached to door 108 so as not to impede the path of a semiconductor substrate into and out of the chamber and at the same time remain outside the sealing perimeter of seal 218. Door seal 218 is configured to seal the internal surface around the opening of port loading slot 208 in the chamber. As demonstrated by FIG. 10, door 108 is positioned inside the chamber.

Figure 11A:
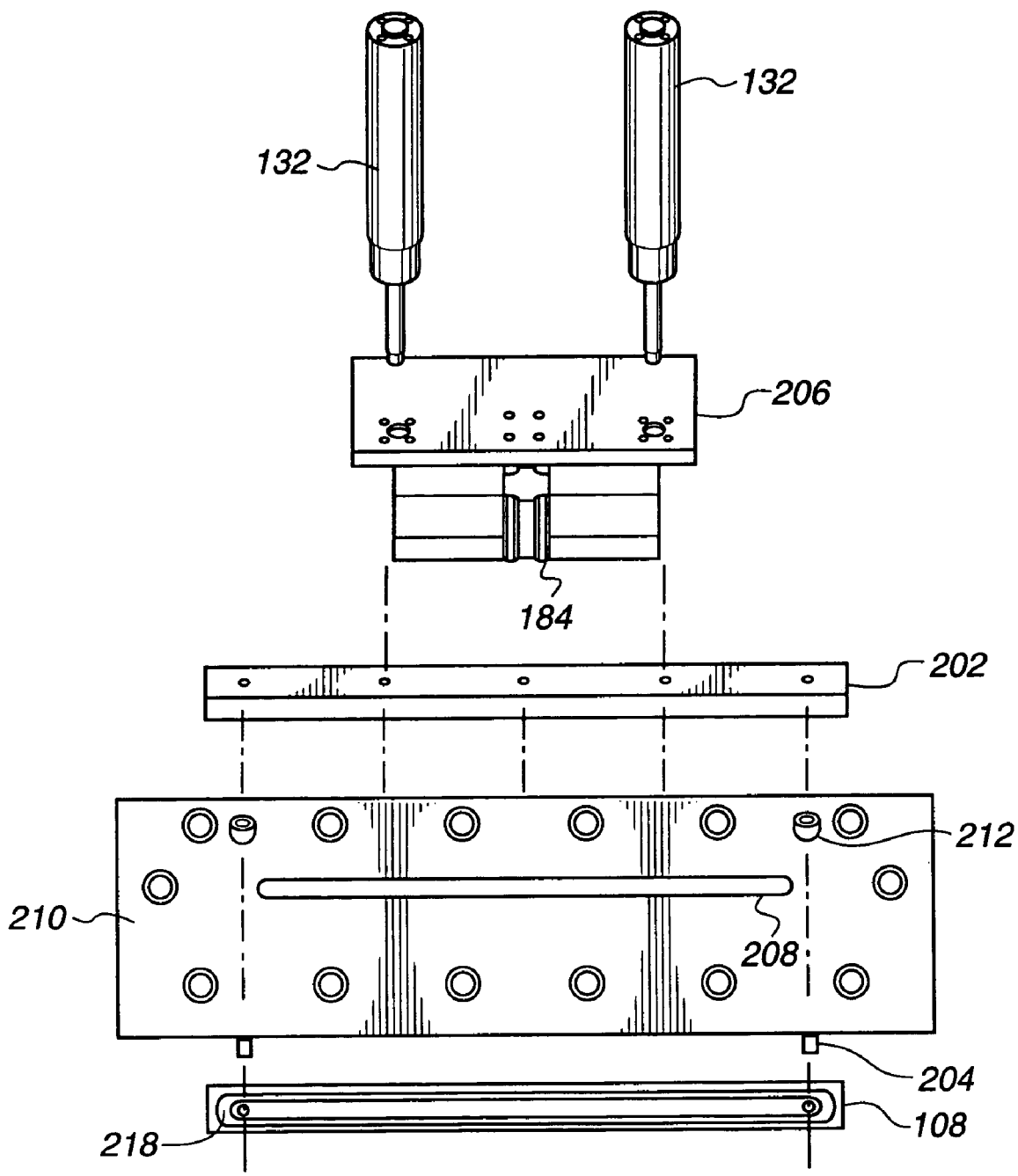
FIG. 11A illustrates a plan view of the various components comprising the door actuating mechanism in accordance with one embodiment of the invention.

FIG. 11A illustrates a plan view of the various components comprising the door actuating mechanism in accordance with one embodiment of the invention. Door seal 218 is configured to enclose the internal opening of the port loading slot 208. In one embodiment door seal 218 is an o-ring. It should be appreciated that the door seal 218 can be any elastomeric material such as Buna-n, Viton, CAL-REZ™, CHEMRAZ™, Teflon, Silicone, polyurethane and the like, which is chemically compatible with the process to be performed in the chamber.

FIG. 11B illustrates exemplary embodiments of the door seal 218 in accordance with one embodiment of the invention. In these exemplary embodiments, the door seal 218 may take the shape of o-rings 266 or have a non-circular cross-section such as those found in U-cups 268, flat gaskets 272, etc. Additionally, the seals may be equipped with back-up rings 270 that enhance stability. It should be appreciated that FIG. 11B is provided for illustrative purposes only and not meant to be limiting as the door seal 218 can take on a number of shapes and orientations.

Returning to FIG. 11A, while door seal 218 is shown attached to door 108, in another embodiment door seal 218 can be attached to the internal surface of the chamber around the port opening 208 and the door 108 is brought into contact with the door seal. It should be further appreciated that door actuation rod 204 is attached to door 108 so that when door 108 is in a closed position, door actuation rod 204 is not exposed to the internal cavity of the chamber.

Figure 12:
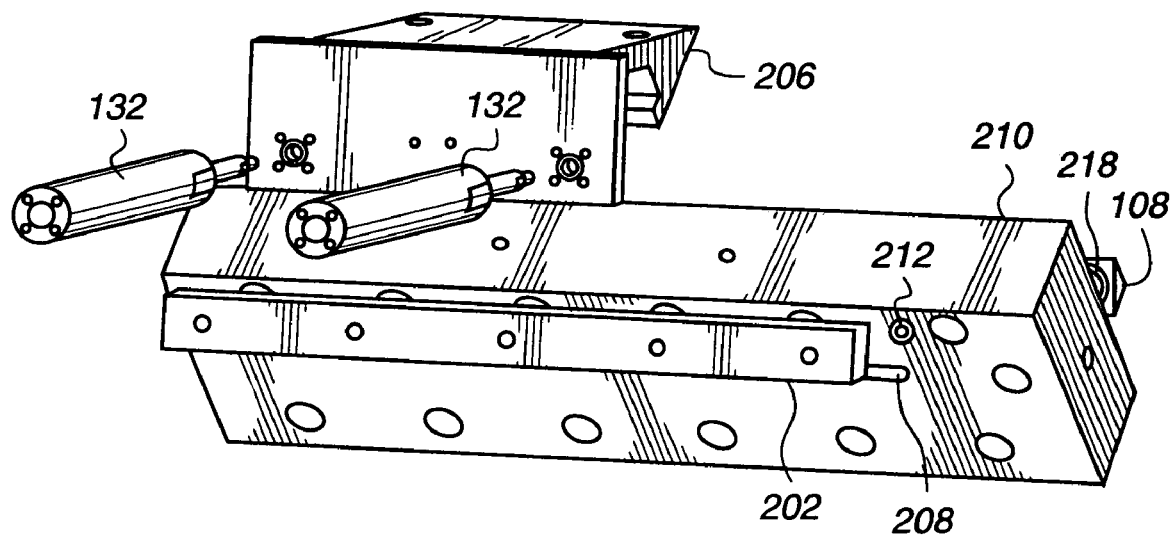
FIG. 12 illustrates another plan view of the various components of the door actuating mechanism in accordance with one embodiment of the invention.

FIG. 12 illustrates another plan view of the various components of the door actuating mechanism in accordance with one embodiment of the invention. As can be seen by FIG. 12, door 108 is shown on one side of door holder 210 connected to the remainder of the door actuating mechanism on different sides of door holder 210. It should be appreciated that door closing cylinders 132 provide the initial sealing of the door 108 to the internal surface of the chamber when the door cylinders 132 close the door 108 as described above. Once the chamber door 108 is closed, the chamber is pressurized thus placing a force on the door 108 which is transferred to the internal surface of the chamber. Accordingly, as the internal pressure is increased in the chamber, the door 108 is pressure-sealed more tightly against the internal surface of the chamber.

Figure 13:
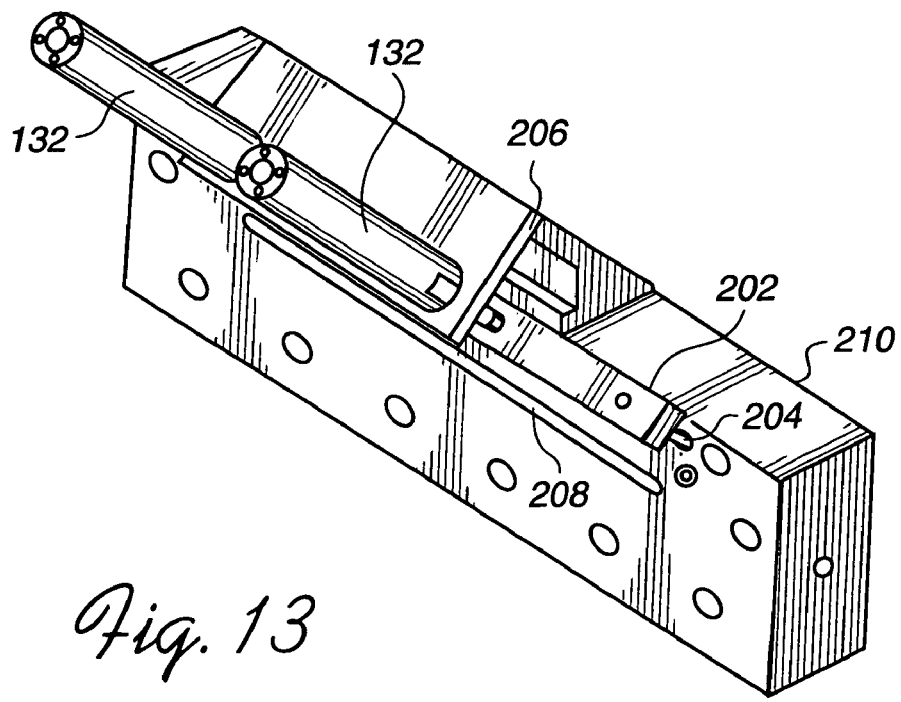
FIG. 13 displays a plan view from a side angle of the components comprising the door actuating mechanism in accordance with one embodiment of the invention.

FIG. 13 displays a plan view from a side angle of the components comprising the door actuating mechanism in accordance with one embodiment of the invention. In one embodiment of the invention, the door closing cylinders 132, cylinder bracket 206 and door actuation bar 202 are placed outside the chamber load port. Thus, as mentioned in reference to FIG. 5, a scavenger hood or airlock may be employed to provide a cleaner environment in the vicinity of the path traversed by the substrate.

Figure 14:
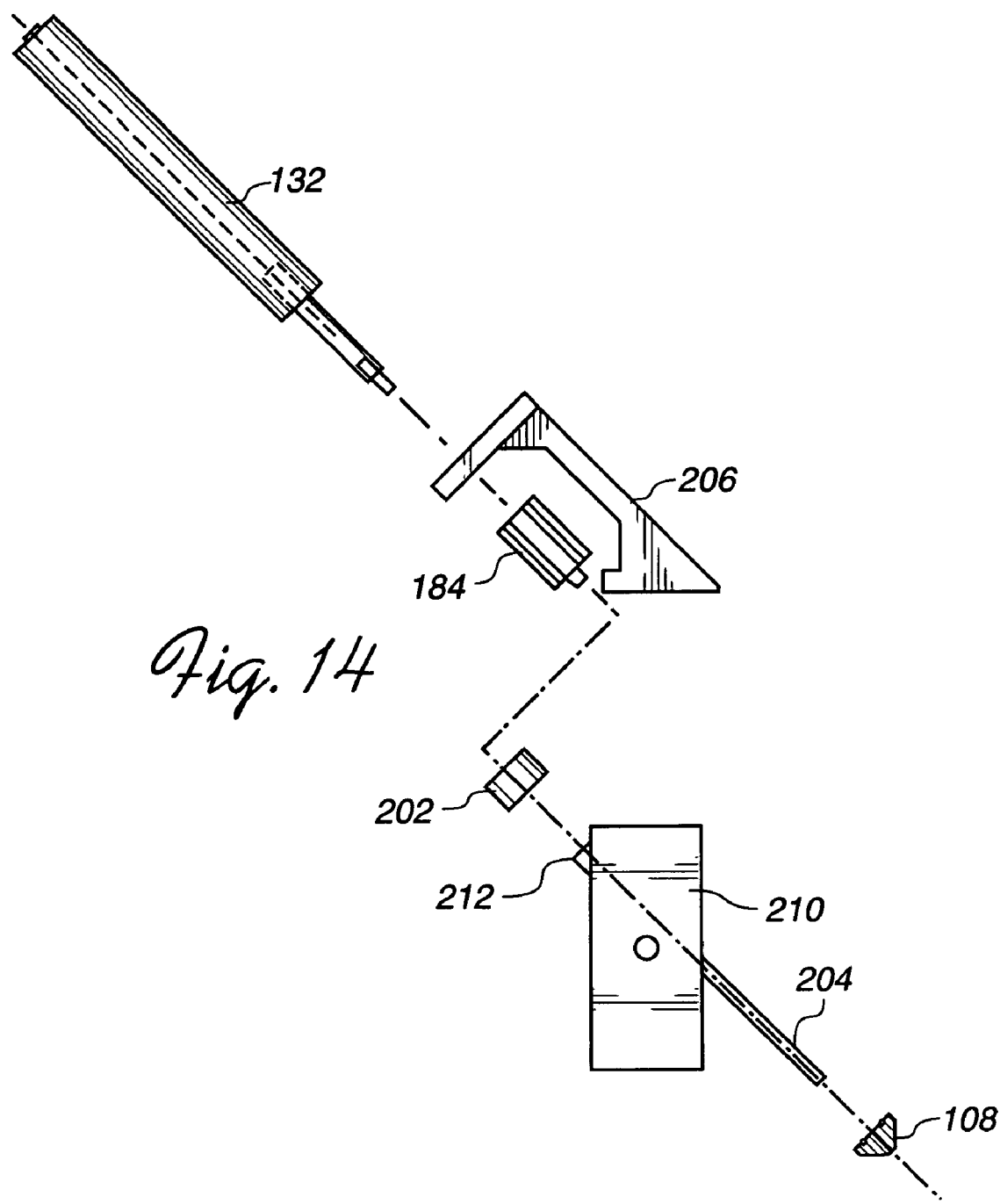
FIG. 14 illustrates a side view of the various components comprising the door actuating mechanism in accordance with one embodiment of the invention.

FIG. 14 illustrates a side view of the various components comprising the door actuating mechanism in accordance with one embodiment of the invention. Bore 212 includes a Teflon™ bushing allowing door actuation rod 204 to slidably move the door between an open and closed position. It should be appreciated that depending on whether the door closing cylinder 132 or the door opening cylinder 184 is acting on the door, actuation bar 202 determines if the door transitions to an open or closed position.

Figure 15A:
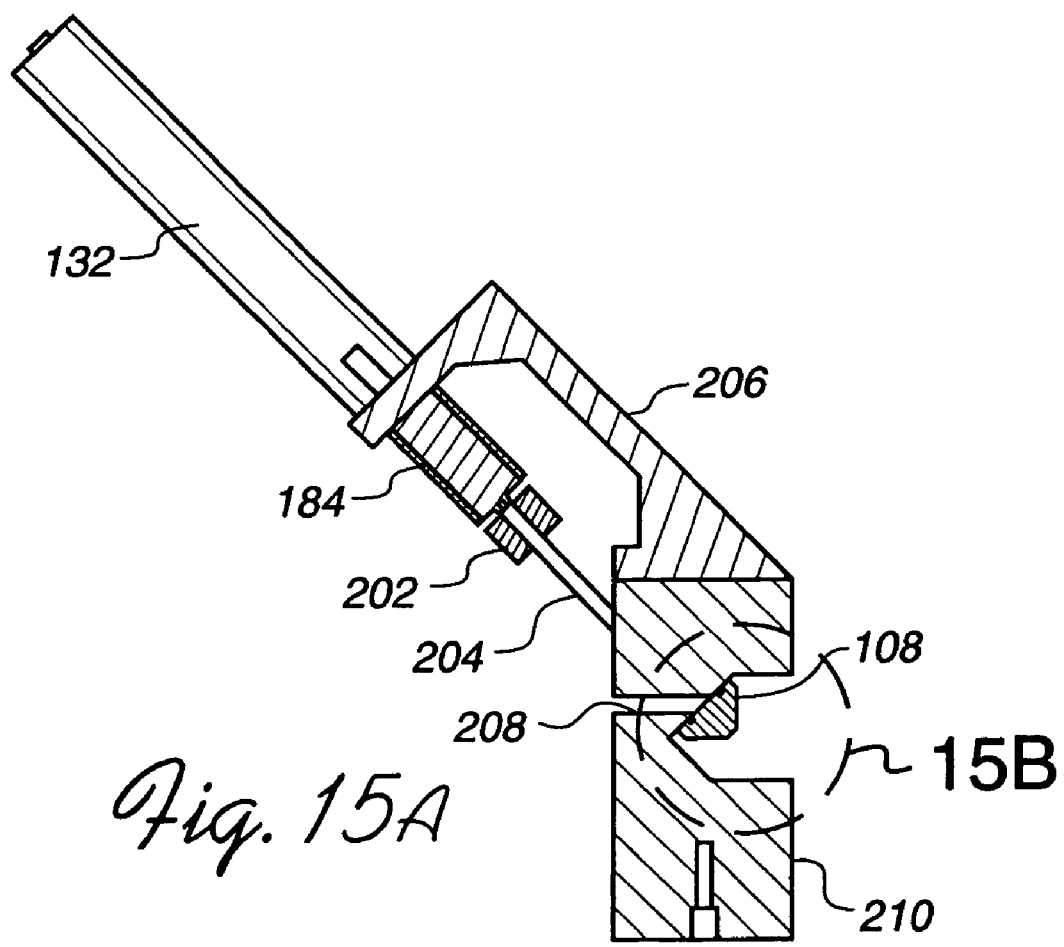
FIG. 15A illustrates an internal side view of the door actuating mechanism in accordance with one embodiment of the invention.

FIG. 15A illustrates an internal side view of the door actuating mechanism in accordance with one embodiment of the invention. In a preferred embodiment the opening of the port loading slot 208 is ⅜ of an inch in height and the door 108 is triangular in shape. Of course, the door is not limited to a triangular shape and may be any shape capable of providing a seal with the internal surface of the chamber and withstanding the elevated internal operating pressures.

Figure 15B:
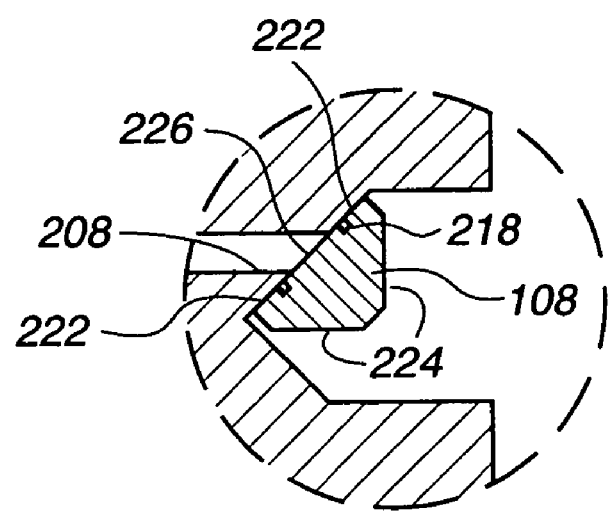
FIG. 15B illustrates an exploded view of the door of FIG. 15A in accordance with one embodiment of the invention.

FIG. 15B illustrates a detailed view of the door 108 of FIG. 15A in accordance with one embodiment of the invention. As illustrated in FIG. 15B, door 108 seals against the internal surface 222 of the chamber. In one embodiment, the seal is an o-ring configured to sit in a cavity of the door 108. As mentioned above, the o-ring may also be placed against the internal surface 222 of the chamber and the door 108 compresses against the o-ring to make a seal in another embodiment. In a preferred embodiment the door is made of stainless steel or any high-strength, corrosion-resistant alloy of nickel. In another embodiment, the door is made of aluminum, titanium, or their respective alloys. In another preferred embodiment, the two sides 224 of the door are approximately 1 inch and the third side 226 is approximately 1.4 inches. While FIG. 15B displays the edges where sides 224 meet side 226 as being smoothed or flattened, these edges are sharp or pointed in another embodiment.

Figure 15C:
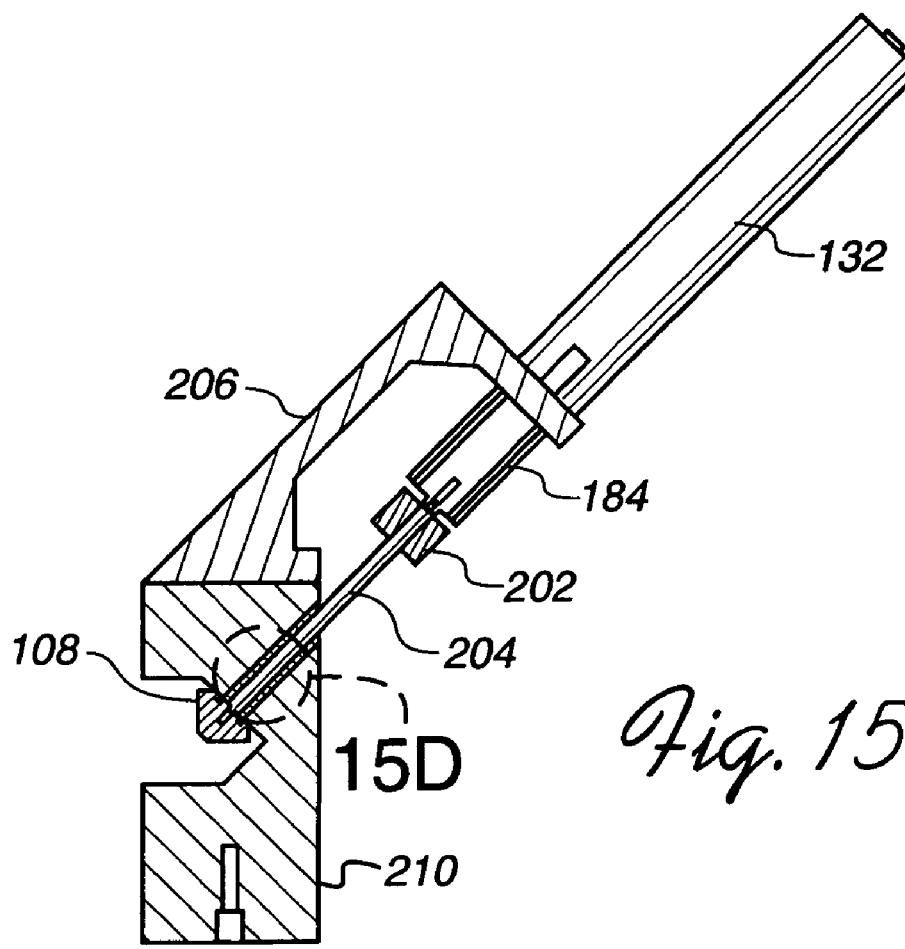
FIG. 15C illustrates another internal side view of the door actuating mechanism in accordance with one embodiment of the invention.

FIG. 15C illustrates another internal side view of the door actuating mechanism in accordance with one embodiment of the invention. As illustrated in FIG. 15C, door actuation rod 204 is positioned through the door holder 210 so as to not interfere with port loading slot 208 (not shown). Door closing cylinder 132 actuates to provide the initial sealing of the door 108. As the pressure inside the chamber is increased the door 108 is forced tighter against the seal and the internal surface. Accordingly, the seal becomes stronger as the pressure is increased.

Figure 15D:
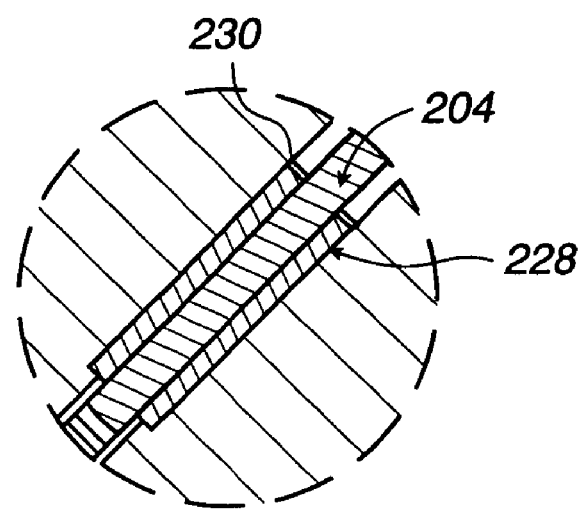
FIG. 15D illustrates an exploded view of the door actuation rod travelling through the door holder in accordance with one embodiment of the invention.

FIG. 15D illustrates a detailed view of the door actuation rod 204 travelling through the door holder 210 in accordance with one embodiment of the invention. A TEFLON™ bushing 228 provides a low friction surface so that the door actuation rod 204 can slide as the door closing cylinder 132 or door opening cylinder 184 are actuated. Additionally, the bushing 228 provides a gimballing effect to allow for a uniform initial seal. Of course the bushing can be made from any plastic such as, Kynar, polyethylene, polypropylene, PVC, acetal, etc. The bushing 228 is held in place by retainer 230.

Figure 16:
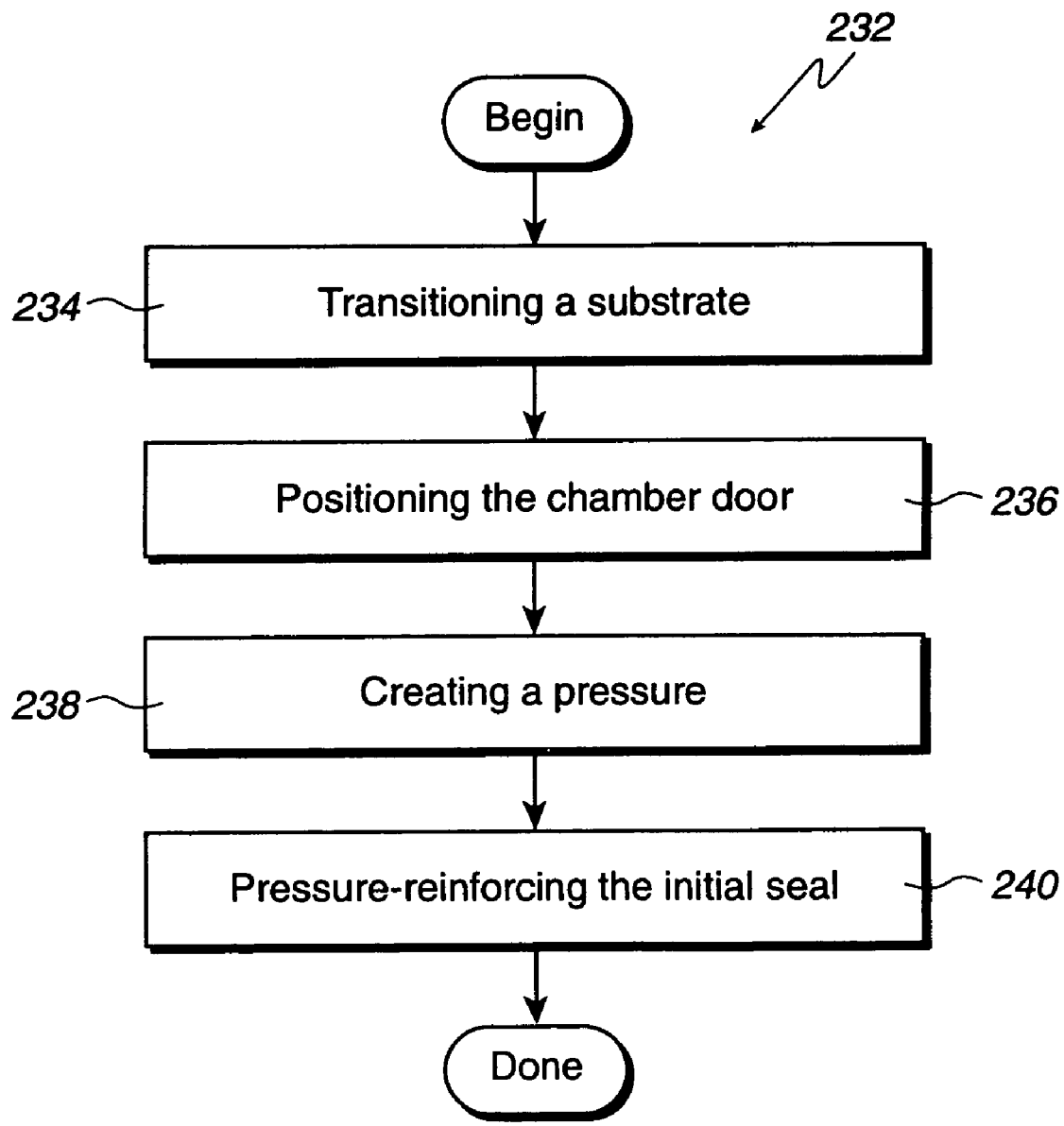
FIG. 16 illustrates a flowchart which displays a method for sealing a process chamber with an intrinsically safe chamber door which is positioned on the inside of the chamber and where the chamber operates at an elevated internal pressure in accordance with one embodiment of the invention.

FIG. 16 illustrates flowchart 232 which displays a method for sealing a process chamber with an intrinsically safe chamber door which is positioned on the inside of the chamber and where the chamber operates at an elevated internal pressure in accordance with one embodiment of the invention. The method initiates with transitioning a substrate through an opening of the processing chamber. Here, a substrate passes through a port loading slot into or out of the chamber. Next, the chamber door is positioned to form an initial seal against an internal surface of the chamber around the opening of the port loading slot. In one embodiment, the door closing cylinders actuate to slide the door actuation rod and the door into a closed position over the port opening. As discussed above, the door seal is compressed against the internal surface of the chamber to form an initial seal. Next, a pressure is created in the chamber. In one embodiment, carbon dioxide and reagents such as ethanol, methanol, NMP, various amines and oxidizers, etc. In another embodiment, the chamber operates at pressures up to about 5000 psi. In a preferred embodiment, the chamber operates at a pressure between about 2000 psi and about 4500 psi.

Continuing with FIG. 16, the initial seal between the chamber door and the internal surface of the chamber is pressure sealed. Here, the internal pressure of the chamber forces the door against the internal surface of the chamber. Thus, the seal is compressed further i.e., the sealing force increases as the pressure is increased. The inside-out sealing of the door can be combined with the various interlocking schemes described above to provide a robust and safe door for the high pressure semiconductor operations.

The door mechanism described above utilized a slider mechanism to move the door from one position to another. It should be appreciated that door actuating mechanism can include other linear or rotary motion actuating mechanisms such as, a lead screw, ball slide, etc. Furthermore, the cylinders or actuators employed to transition the door can either be pneumatic, hydraulic or electrical.

Figure 17:
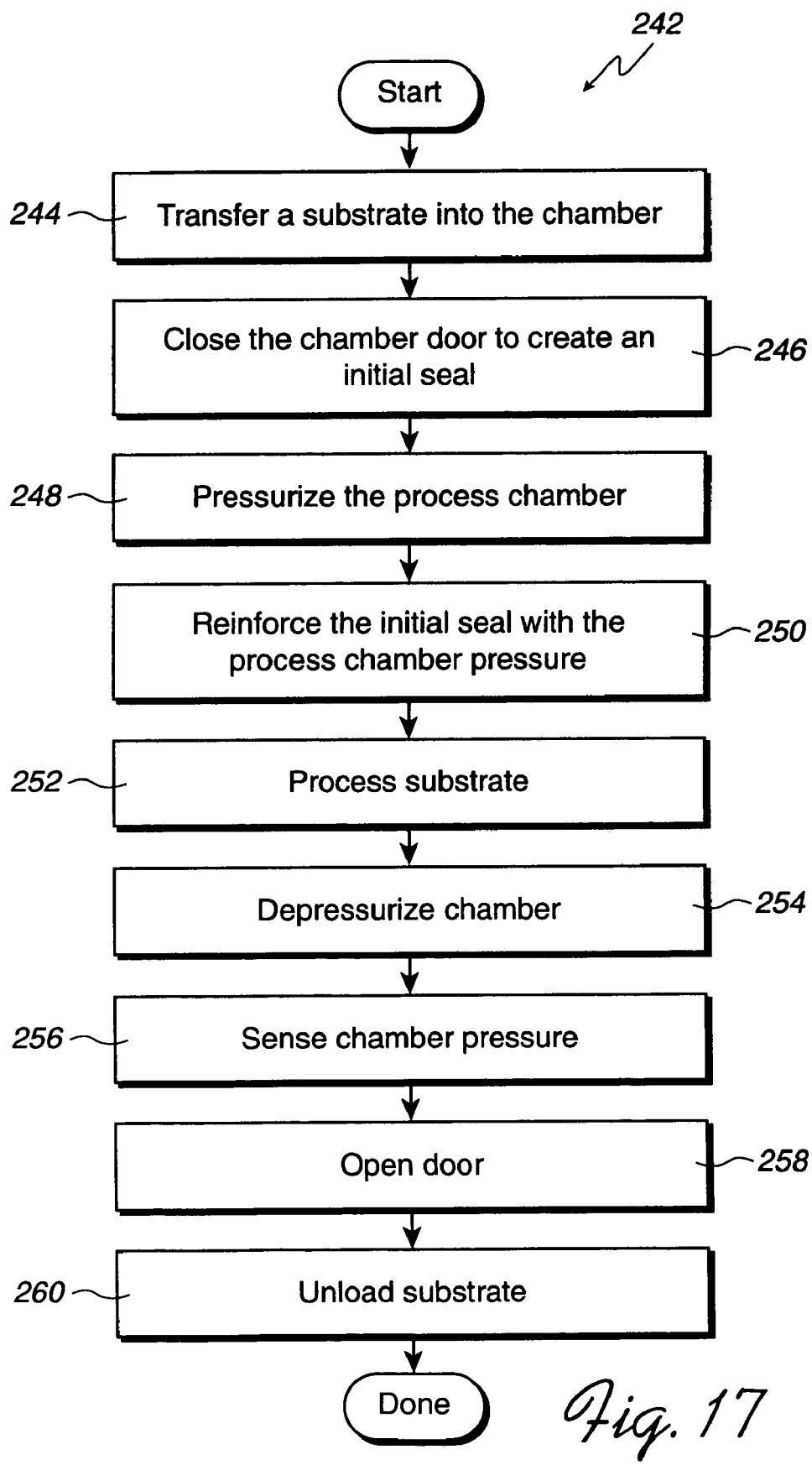
FIG. 17 illustrates a flowchart which displays a more detailed method for sealing a process chamber with a door positioned on the inside of the chamber in accordance with one embodiment of the invention.

FIG. 17 illustrates flowchart 242 displaying a more detailed method for sealing a process chamber with a door positioned on the inside of the chamber in accordance with one embodiment of the invention. Flowchart 242 initiates with operation 244 where a substrate is transferred into a chamber. The method then advances to operation 246 where the chamber door is closed to create an initial seal. In one embodiment, the chamber door makes an initial contact with the seal through a door actuating mechanism as described above. Here the actuator force provides the initial seal. The method then proceeds to operation 248 where the process chamber is pressurized. In one embodiment, the process chamber is pressurized in order to perform super critical carbon dioxide processing. Then, in operation 250 a chamber pressure reinforces the initial seal. Here, the pressure reinforces the sealing force since the chamber door seals from the inside out. The method then moves to operation 252 where the substrate is processed. For example, the super critical carbon dioxide processing would be performed here in one embodiment. Upon completion of the processing the chamber is depressurized in operation 254. Then, in operation 256, a chamber pressure is sensed by a pressure switch. In one embodiment, the pressure switch is the pressure switch 156 referred to in FIGS. 3 and 7. Moving to operation 258 the chamber door is opened when allowed by the pressure switch. Here the door is interlocked with the pressure switch so that the door can not be inadvertently opened when pressure above a certain threshold pressure exists in the chamber. Once the door is allowed to open, the substrate is unloaded in operation 260.

Figure 18:
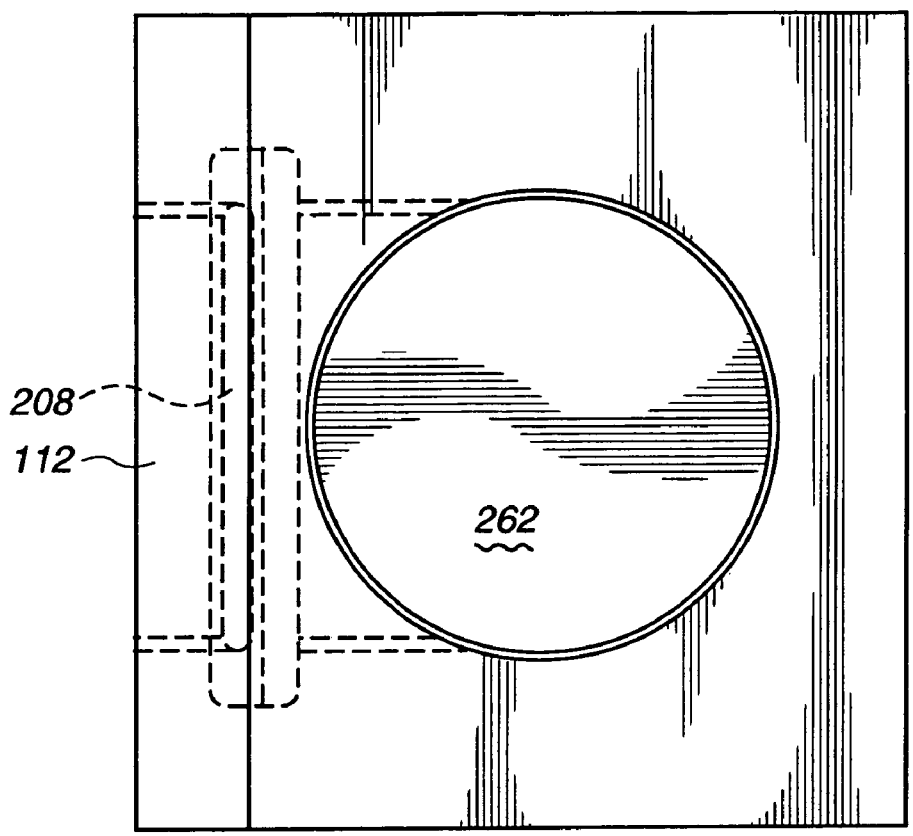
FIG. 18 illustrates a top view of a process chamber in which the chamber door is an integral component of the chamber bottom in accordance with one embodiment of the invention.

FIG. 18 illustrates a top view of a process chamber in which the chamber door is an integral component of the chamber bottom in accordance with one embodiment of the invention. A substrate is introduced into the load port 112 through the load port slot 208 in order to enter the process cavity 262. Here, the chamber door and the chamber bottom are an integral piece, that is milled, forged, etc. from one solid piece of material, rather than the chamber door region being fastened to the chamber bottom. In this embodiment, the robot reach required to place a substrate into the process cavity 262 or remove a substrate from the process cavity 262 is minimized.

Figure 19:
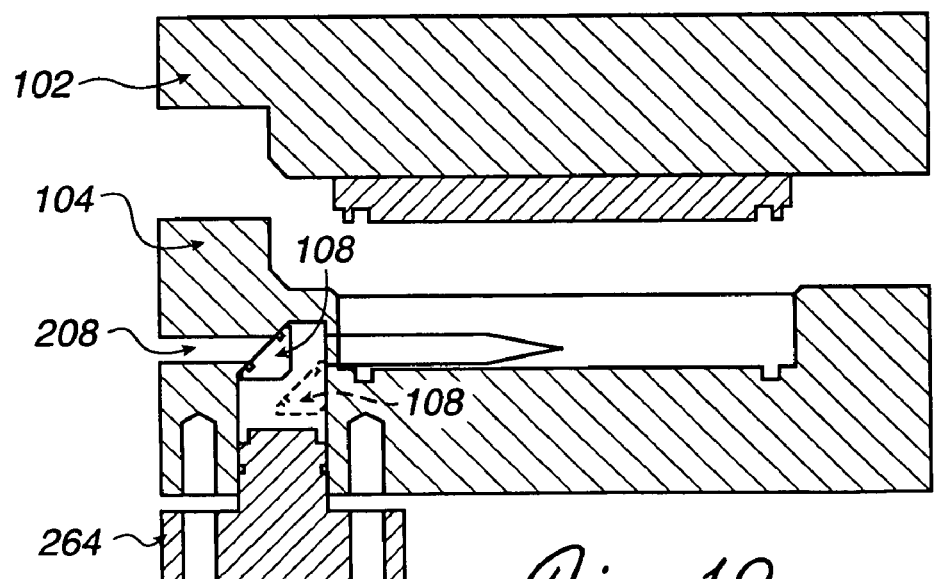
FIG. 19 illustrates a side view of a process chamber in which the chamber door is an integral component of the chamber bottom in accordance with one embodiment of the invention.

FIG. 19 illustrates a side view of a process chamber in which the chamber door is an integral component of the chamber bottom in accordance with one embodiment of the invention. As in FIG. 18, chamber bottom 104 is milled, forged, etc. from one piece of material. As such the reach of a robot arm into and out of the process cavity 262 is minimized as compared with an embodiment where the chamber door region is rigidly fastened to the chamber bottom 104. A chamber door retainer 264 is displayed in FIG. 19 also.

One skilled in the art would appreciate that the chamber door 108 described above can be incorporated into a cluster architecture where appropriate pressures are handled by load locks.

Although the foregoing invention has been described in some detail for purposes of clarity of understanding, it will be apparent that certain changes and modifications may be practiced within the scope of the appended claims. For instance, even though the door is illustrated as a triangular shape, the door can take any form as long as it seals against he internal surface of the chamber. Accordingly, the present embodiments are to be considered as illustrative and not restrictive, and the invention is not to be limited to the details given herein, but may be modified within the scope and equivalents of the appended claims.

What is claimed is:

1. A processing chamber for a substrate, the chamber configured to operate at a positive pressure, comprising:
   a load port slot, the load port slot providing access for the substrate into and out of the chamber;
   a chamber door, the chamber door positioned inside the chamber, the chamber door configured to seal against an internal surface of the chamber thereby blocking access through the load port slot, wherein an internal pressure of the chamber assists in sealing the chamber door against the internal surface of the chamber; and
   a door actuating mechanism, the door actuating mechanism configured to move the door along a door path, the door path positioned at an angle to a path to be traversed by the substrate, the door actuating mechanism including a single door opening cylinder having a first and second end, the first end of the door opening cylinder affixed to a bottom surface of a cylinder bracket, the second end of the door opening cylinder affixed to a top surface of a door actuating bar, the door actuating mechanism further including first and second door closing cylinders being affixed to a top surface of the cylinder bracket.

2. The processing chamber as recited in claim 1, wherein a size of the single door opening cylinder prevents the door from opening when the internal pressure of the chamber is at or above a defined pressure.

3. The processing chamber as recited in claim 1, wherein the chamber door forms a seal against the internal surface of the chamber by compressing an o-ring.

4. The processing chamber as recited in claim 1, further including:
   a locking actuator, the locking actuator configured to prevent one of the opening cylinder or the closing cylinders from moving the chamber door.

5. A chamber for processing a semiconductor substrate, the chamber configured to operate while pressurized, comprising:
   a port, the port providing access for the semiconductor substrate into and out of the chamber;
   a moveable door, the door configured to utilize a pressure differential between an internal pressure of the chamber and an external pressure outside of the chamber to seal the port, wherein the door forms a seal with an internal surface of the chamber enclosing the port; and
   a control mechanism, the control mechanism configured to transition the moveable door between an open position and a sealed position, the transition between the open position and the sealed position occurring at an angle to the axis of a path to be traversed by the semiconductor substrate, the control mechanism including a single door opening cylinder having a first and second end, the first end of the door opening cylinder affixed to a bottom surface of a cylinder bracket, the second end of the door opening cylinder affixed to a top surface of a door actuating bar, the door actuating mechanism further including first and second door closing cylinders being affixed to a top surface of the cylinder bracket.

6. The chamber as recited in claim 5, wherein an interlock provides assurance that the chamber door is closed prior to pressurizing the chamber.

7. The chamber as recited in claim 5, wherein the moveable door is positioned inside the chamber.

8. The chamber as recited in claim 5, wherein the moveable door includes one of a mechanical safety, an electrical safety and a software safety.

9. The processing chamber as recited in claim 1, wherein the door actuating mechanism is not exposed to an internal cavity of the chamber when the chamber door is sealed against the internal surface of the chamber.

10. The chamber as recited in claim 5, wherein the control mechanism is not exposed to an internal cavity of the chamber when the chamber door is in the sealed position.

\* \* \* \* \*